(12) United States Patent
Lai et al.

(10) Patent No.: US 6,471,533 B2
(45) Date of Patent: Oct. 29, 2002

(54) RETENTION MODULE FOR SECURING HEAT SINK

(75) Inventors: Ming-Chun Lai, Tu-Chen (TW); Hung-Chi Yu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/033,312

(22) Filed: Dec. 26, 2001

(65) Prior Publication Data

US 2002/0081882 A1 Jun. 27, 2002

(30) Foreign Application Priority Data

Dec. 27, 2000 (TW) ..................... 89222560 U

(51) Int. Cl.$^7$ ............................ H01R 13/62; H05K 7/20
(52) U.S. Cl. ........................ 439/331; 439/342; 361/704
(58) Field of Search .................. 439/330, 331, 439/342, 66, 71; 361/704, 707, 709, 711, 712, 715, 718, 719

(56) References Cited

U.S. PATENT DOCUMENTS

| 5,548,482 | A | * | 8/1996 | Hatauchi et al. | ............ 439/331 |
| 5,600,540 | A | * | 2/1997 | Blomquist | ................ 361/704 |
| 5,651,688 | A | * | 7/1997 | Lin | .......................... 439/331 |
| 6,004,141 | A | * | 12/1999 | Abe et al. | ................ 439/331 |

* cited by examiner

*Primary Examiner*—Hien Vu
(74) *Attorney, Agent, or Firm*—WeiTe Chung

(57) ABSTRACT

A retention module for securing a heat sink (4) to a board-mounted socket connector (2) comprises a pair of metal frames (5) and four screws (54) for securing the frames to the PCB. Each frame includes a bottom wall (50), a pair of first side walls (51) and a second side wall (52) together defining a receiving space (53) for receiving a side portion of the heat sink. The bottom wall includes an integrally formed grounding plate (50c) to contact the heat sink. The retention module further comprises a pair of clips (6) assembled to the frames thereby increasing the securing relationship between the heat sink and the frames.

4 Claims, 4 Drawing Sheets

RETENTION MODULE FOR SECURING HEAT SINK

BACKGROUND OF THE INVENTION

1. Field of the Invention

The present invention relates to a retention module, and particularly to a retention module to secure a heat sink to a board-mounted CPU socket connector assembly.

2. Description of Related Art

Referring to FIG. 4, a conventional socket connector 12 is mounted at a PCB 14 for electrically connecting a CPU (Central Processing Unit) 11 to the PCB (Printed Circuit Board) 14. A heat sink 16 is assembled to the CPU by a pair of insulating locking devices 13 to dissipate the heat generated by the CPU. The locking devices 13 are secured to the PCB by a pair of locks 17. A pair of metal grounding plates 15 (only one being shown) are secured to the locking devices 13 and contact the heat sink 16 for grounding electrostatic charge accumulated on the heat sink 16 to the PCB. However, the locking devices 13 and the grounding plates 15 must be manufactured respectively and then assembled together because of their different materials, thereby increasing manufacturing and assembling costs.

SUMMARY OF THE INVENTION

Accordingly, the object of the present invention is to provide a retention module having integrally formed locking device and grounding plates thereby decreasing manufacturing and assembling costs.

In order to achieve the object set forth, a retention module for a socket connector of the present invention is used to secure a heat sink mounted on a CPU. The heat sink comprises a flat base and a plurality of fins secured on the base. The retention module comprises a pair of metal frames. Each frame includes a bottom wall, a pair of first side walls, and a second side wall connected with the bottom wall. The bottom walls, the first and second side walls of the frame together define a receiving space for receiving a side portion of the sink. Each second side wall forms a pair of hooks at two opposite lateral edges thereof engaged to a corresponding first side wall. Each bottom wall defines a pair of screw holes for screwing a pair of screws, and a pair of grounding plates extending toward the heat sink to contact the heat sink.

Other objects, advantages and novel features of the invention will become more apparent from the following detailed description of the preferred embodiment when taken in conjunction with the accompanying drawings.

DETAILED DESCRIPTION OF THE INVENTION

Figure 1:
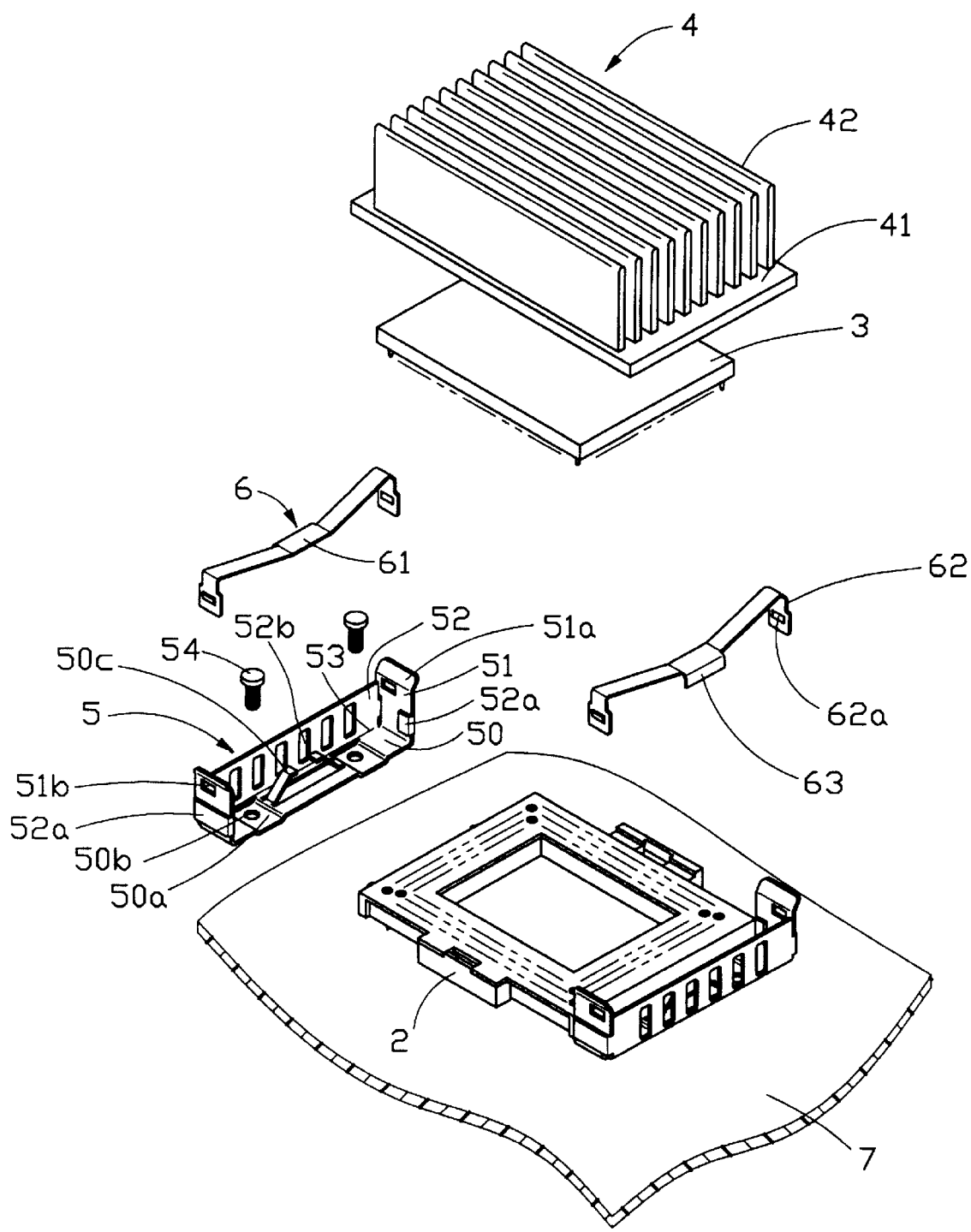
FIG. 1 shows a retention module in accordance with the present invention together with associated socket connector and heat sink.

Reference will now be made to the drawing figures to describe the present invention in detail.

Figure 2:
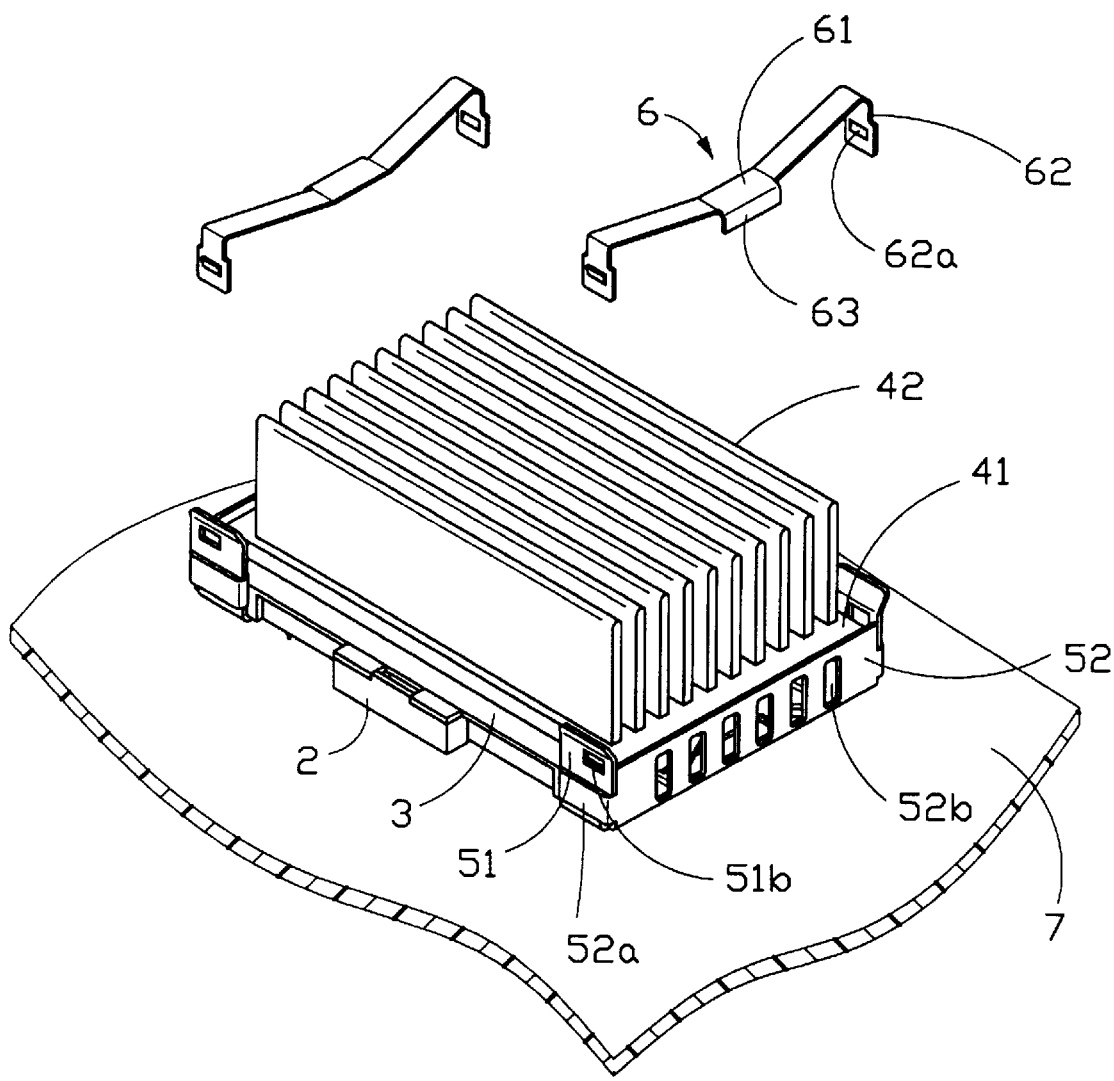
FIG. 2 is a partially assembled view of FIG. 1.

Referring to FIGS. 1 and 2, a retention module of an electrical connector 2 of the present invention is used for securing a heat sink 4 to a PCB 7. The heat sink 4 comprises a flat base 41 and a plurality of fins 42 on the base 41.

The retention module includes a pair of metal frames 5 and a pair of screws 54 for screwing the frames 5 to the PCB 7. Each frame 5 includes a bottom wall 50, a pair of first side walls 51 and a second side wall 52 connected with the bottom wall 50. The bottom wall 50, the first side walls 51 and the second side wall 52 together define a receiving space 53 for receiving a side portion of the base 41 of the heat sink 4. Each bottom wall 50 defines a pair of depressed walls 50a with respect to a top surface thereof for abutting against a top surface of the PCB 7. Each depressed wall 50a defines a screw hole 50b for insertion of a corresponding screw 54. Each bottom wall 50 further forms a pair of confrontingly extending grounding plates 50c for contacting a bottom of the base 41 of the heat sink 4. Each first side wall 51 forms an outward inclined guiding surface 51a for benefiting insertion of the heat sink 4. A through hole 51b is defined at each first side wall 51 below the guiding surface 51a. Each second side wall 52 forms a pair of hooks 52a hooking at a corresponding first side wall 51. Each second side wall 52 further defines a plurality of through holes 52b for assisting dissipating the heat generated by the CPU 3.

The retention module further comprises a pair of clips 6. Each clip 6 comprises a flat pressing portion 61 at a middle thereof for pressing the top surface of the base 41 of the heat sink 4, and a pair of securing portions 62 beside the pressing portion 61. Each securing portion 62 has a securing plate 62a to be engaged to the through hole 51b of the first side wall 51. Each clip 6 further comprises an abutting portion 63 at an outer side of the pressing portion 61 for abutting against an outer surface of the second side wall 52.

Figure 3:
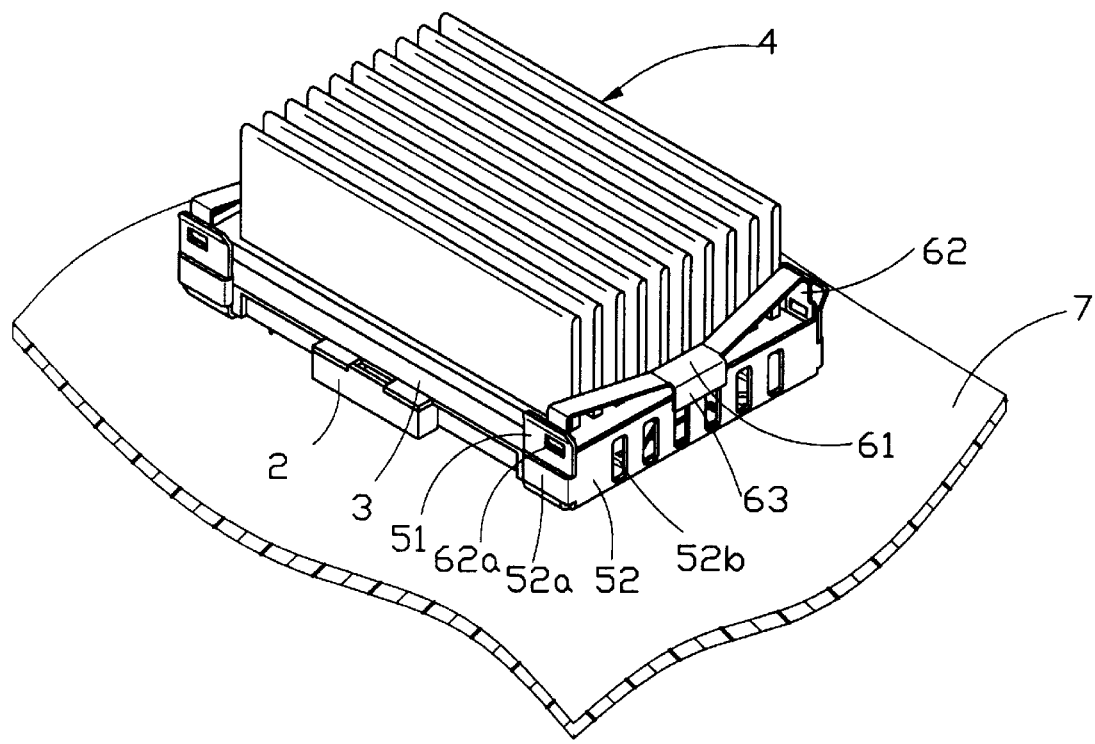
FIG. 3 is a fully assembled view of FIG. 1.
Figure 4:
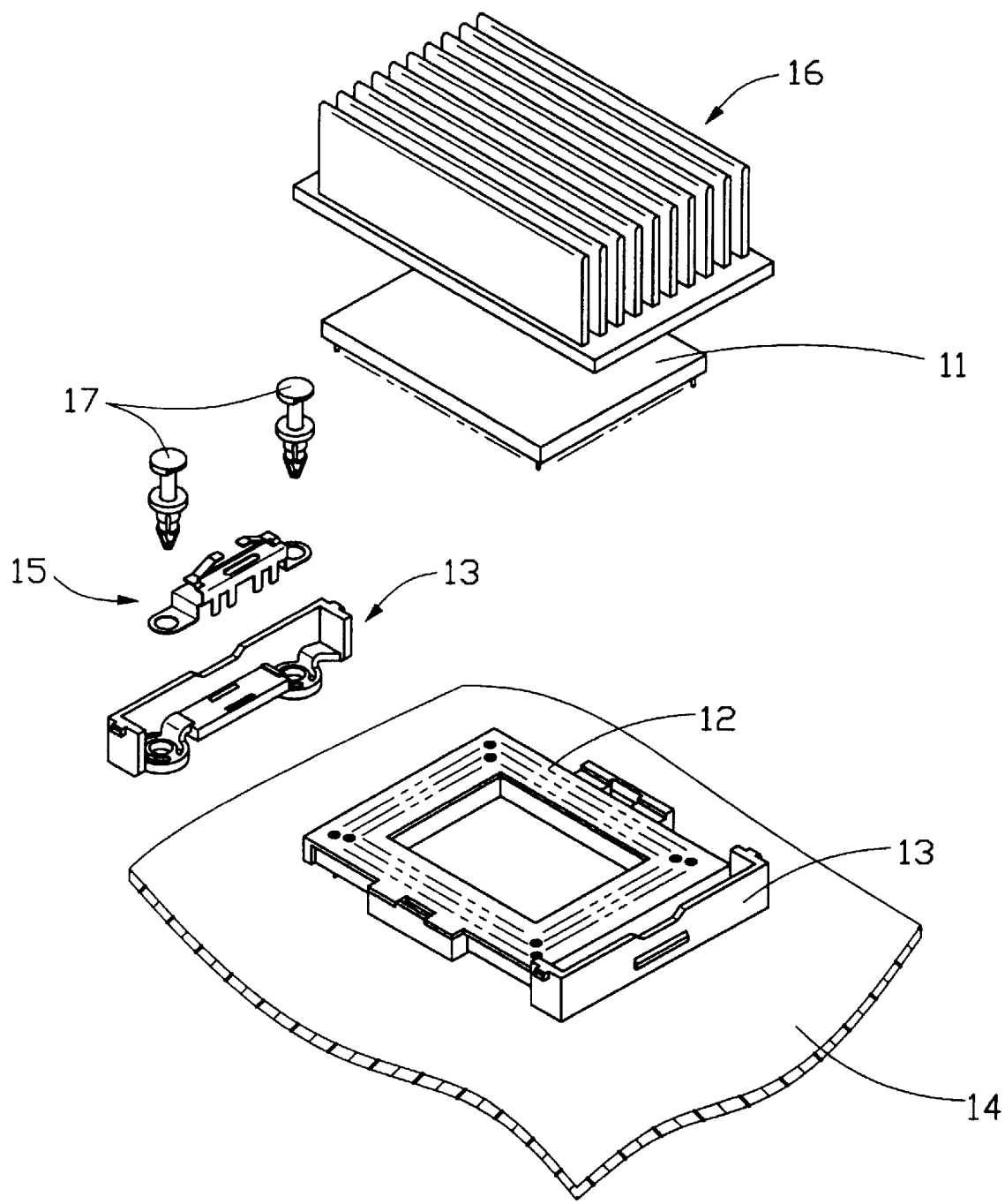
FIG. 4 is an exploded view of a conventional retention module and related elements used therewith.

Referring to FIGS. 1 to 3, in assembly, the connector 2 and the frames 5 are mounted to the PCB 7 in turn. The screws 54 are screwed to the screw holes 50b of the frames 5. The CPU 3 with the heat sink 4 together is then assembled on the connector 2. The pressing portions 61 of the clips 6 downwardly press the top surface of the base 41 of the heat sink 4 and the abutting portions 63 of the clips 6 abut against outer surfaces of the second side walls 52 of the frames 5. The securing plates 62a of the securing portions 62 are engaged to the securing holes 51b of the first side walls 51. Thus, the retention module firmly secures the heat sink 4 to the CPU 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention module for securing a heat sink to a board-mounted CPU (Central Processing Unit) socket connector assembly, the module comprising:

a pair of metal frames each having a bottom wall, a pair of first side walls and a second side wall, the bottom wall, the first side walls and the second side wall together defining a receiving space for receiving a side portion of the heat sink, the bottom wall integrally forming a grounding plate for contacting the heat sink; and a pair of clips secured to the metal frames and each including a pressing portion to press the heat sink against the socket connector assembly, further comprising plural screws, the bottom walls of the metal frames defining corresponding number of screw holes therein for screwing the screws wherein each clip includes a securing plate formed at each of two opposite ends of the pressing portion, the first side wall defining through holes at a top thereof to retain the securing plate of the clip; wherein the first side wall defines an inclined guiding surface at the top thereof for benefiting insertion of the heat sink.

2. The retention module as claimed in claim 1, wherein the second side wall defines a plurality of through holes.

3. A socket connector assembly comprising:

a printed circuit board;

a socket mounted upon said printed circuit board;

a pair of metal frame positioned by two sides of said socket, each of said pair of metal frame including a bottom wall with two opposite side walls upwardly extending therefrom;

a CPU (Central Processing Unit) seated upon said socket;

a heat sink including a base seated upon said CPU;

a pair of resilient clips each crossing said base with a pair of securing portions at two ends; wherein said bottom wall is fastened to said printed circuit board, and said pair of securing portions are latched with said pair of side walls, so as to create a grounding path to remove electrostatic charge from the heat sink via said clip and said metal frame toward said printed circuit board.

4. The assembly as claimed in claim 3, wherein at least one spring tang extends from the metal frame and engages the base plate to directly remove said electrostatic charge without via said clip.

* * * * *